US010923329B2

(12) United States Patent
Nishimura et al.

(10) Patent No.: US 10,923,329 B2
(45) Date of Patent: Feb. 16, 2021

(54) SUBSTRATE PROCESSING APPARATUS AND SUBSTRATE PROCESSING METHOD

(71) Applicant: TOKYO ELECTRON LIMITED, Tokyo (JP)

(72) Inventors: Eiichi Nishimura, Miyagi (JP); Akitaka Shimizu, Miyagi (JP); Fumiko Yamashita, Miyagi (JP); Daisuke Urayama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/567,642

(22) Filed: Sep. 11, 2019

(65) Prior Publication Data

US 2020/0111646 A1    Apr. 9, 2020

Related U.S. Application Data

(62) Division of application No. 14/396,032, filed as application No. PCT/JP2013/061289 on Apr. 16, 2013, now abandoned.

(30) Foreign Application Priority Data

May 23, 2012 (JP) ................................ 2012-117507

(51) Int. Cl.
*H01J 37/32* (2006.01)
*H01L 43/12* (2006.01)
*H01L 21/67* (2006.01)

(52) U.S. Cl.
CPC ........ *H01J 37/32513* (2013.01); *H01J 37/32* (2013.01); *H01J 37/32357* (2013.01);
(Continued)

(58) Field of Classification Search
CPC ........... H01J 37/32513; H01J 37/32724; H01J 37/32357; H01J 37/32449;
(Continued)

(56) References Cited

U.S. PATENT DOCUMENTS 5,124,014 A   6/1992  Foo et al.
5,221,424 A   6/1993  Rhoades
(Continued)

FOREIGN PATENT DOCUMENTS

JP    1-211920 A     8/1989
JP    2009-88284 A   4/2009
(Continued)

OTHER PUBLICATIONS

European Office Action issued in Application No. 13794483.1, dated Mar. 25, 2019, 8 pages.
(Continued)

*Primary Examiner* — Lan Vinh
(74) *Attorney, Agent, or Firm* — Rothwell, Figg, Ernst & Manbeck, P.C.

(57) ABSTRACT

An apparatus for processing reaction products that are deposited when an etching target film contained in a target object to be processed is etched is provided with: a processing chamber; a partition plate; a plasma source; a mounting table; a first processing gas supply unit; a second processing gas supply unit. The processing chamber defines a space, and the partition plate is arranged within the processing chamber and divides the space into a plasma generating space and a substrate processing space, while suppressing permeation of ions and vacuum ultraviolet rays. The plasma source generates a plasma in the plasma forming space. The mounting table is arranged in the substrate processing space to mount the target object thereon.

14 Claims, 18 Drawing Sheets

(52) U.S. Cl.
CPC .. *H01J 37/32422* (2013.01); *H01J 37/32449* (2013.01); *H01J 37/32724* (2013.01); *H01J 37/32834* (2013.01); *H01L 21/67069* (2013.01); *H01L 43/12* (2013.01); *H01J 2237/334* (2013.01)

(58) Field of Classification Search
CPC ........... H01J 37/32834; H01J 37/32422; H01J 37/32; H01J 2237/334; H01L 43/12; H01L 21/67069; H01L 21/3065
USPC ....... 438/706, 710, 712, 714, 717, 719, 736, 438/742, 758, 730, 731
See application file for complete search history.

(56) References Cited

U.S. PATENT DOCUMENTS

| | | | |
|---|---|---|---|
| 5,811,022 A | | 9/1998 | Savas et al. |
| 6,162,323 A | * | 12/2000 | Koshimizu ......... H01J 37/3244 156/345.26 |
| 2003/0077883 A1 | | 4/2003 | Ohtake |
| 2003/0098288 A1 | * | 5/2003 | Mori ................ H01J 37/32871 216/2 |
| 2004/0137749 A1 | | 7/2004 | Ying et al. |
| 2007/0281105 A1 | * | 12/2007 | Mokhlesi ................ C23C 16/40 427/569 |
| 2007/0281106 A1 | | 12/2007 | Lubomirsky et al. |
| 2007/0286967 A1 | | 12/2007 | Ide et al. |
| 2008/0286075 A1 | * | 11/2008 | Horii ........................ B08B 7/00 414/147 |
| 2009/0029564 A1 | | 1/2009 | Yamashita et al. |
| 2010/0206846 A1 | * | 8/2010 | Nishimura ........ C23C 16/45565 216/67 |
| 2011/0192820 A1 | | 8/2011 | Yeom et al. |
| 2014/0083979 A1 | | 3/2014 | Tahara et al. |

FOREIGN PATENT DOCUMENTS

| | | |
|---|---|---|
| JP | 2010-192197 A | 9/2010 |
| JP | 2010-206068 A | 9/2010 |
| JP | 2012-238711 A | 12/2012 |

OTHER PUBLICATIONS

International Search Report dated Jul. 9, 2013 in PCT/JP2013/061289.

* cited by examiner

SUBSTRATE PROCESSING APPARATUS AND SUBSTRATE PROCESSING METHOD

CROSS REFERENCE TO RELATED APPLICATION

This application is a Divisional Application of U.S. application Ser. No. 14/396,032, filed Oct. 21, 2014, which is a 35 U.S.C. 371 National Phase Entry Application from PCT/JP2013/061289, filed Apr. 16, 2013, which claims priority to Japanese Patent Application No. 2012-117507, filed May 23, 2012, the disclosures of which are incorporated herein in their entirety by reference.

FIELD OF THE INVENTION

The present invention relates to a substrate processing apparatus and a substrate processing method.

BACKGROUND OF THE INVENTION

Patent Document 1 discloses a substrate processing method for manufacturing a MRAM (Magnetic Random Access Memory) device by processing a multi-layered object including a Magnetic Tunnel Junction (MTJ) having a lower magnetic layer, an upper magnetic layer and an insulation layer interposed therebetween. More specifically, the MRAM device is manufactured by (a) forming a first mask on an upper electrode layer, (b) plasma-etching the upper electrode layer, the upper magnetic layer and the insulation layer, (c) removing the first mask and conductive reaction products which are generated in the etching and are deposited on a side wall and the like, (d) forming a second mask on the upper electrode layer, (e) etching a lower electrode layer, and (f) removing the second mask and conductive reaction products which are generated in the etching and are deposited on the side wall and the like. In this method, a gas including fluorine containing gas, and $H_2O$ vapor or $NH_3$ is used as a gas for removing the conductive by-products. The gas may be excited by a plasma.

Patent Document 1: U.S. Patent Application Publication No. 2004-0137749

However, when forming a device by etching a layer containing metal, such as a MRAM device or the like, since surfaces of the metal-containing layer is exposed by the etching, the exposed portion may be likely to be oxidized. Therefore, the metal-containing layer needs to be protected by covering the layer with a protection layer made of an insulator. In addition, before covering the layer with the protection layer, it is necessary to remove a reaction product which is produced in the etching and deposited on a side wall and the like by using the method disclosed in Patent Document 1.

The reaction product may contain not only metal but also metal oxide, metal halide or the like. However, in the substrate processing method described in Patent Document 1, a gas as it is reacts with the conductive reaction product or a gas excited by a plasma reacts with the conductive reaction product, so that the reaction product may not be removed properly. Therefore, in the related art, there is a need to provide a substrate processing apparatus and a substrate processing method which are capable of properly removing reaction products generated when an etching target film is etched.

SUMMARY OF THE INVENTION

In accordance with an aspect of the present invention, there is provided a substrate processing apparatus for treating reaction products deposited in etching an etching target layer included in a target object.

The substrate processing apparatus including: a processing chamber defining a space; a partition plate which is disposed in the processing chamber and partitions the space into a plasma generating space and a substrate processing space, the partition plate being configured to suppress transmission of ions and vacuum ultraviolet rays; a plasma source configured to generate a plasma in the plasma generating space; and a mounting table disposed in the substrate processing space for mounting the target object thereon. The substrate processing apparatus further includes: a first processing gas supply unit configured to supply a first processing gas into the plasma generating space, the first processing gas to be dissociated by the plasma to generate radicals; and a second processing gas supply unit configured to supply a second processing gas into the substrate processing space, the second processing gas reacting with the reaction products without being exposed to the plasma.

In the substrate processing apparatus, the partition plate is disposed in the processing chamber whose space is partitioned into the plasma generating space and the substrate processing space by the partition plate. The partition plate transmits neural radicals while suppressing transmission of ions and vacuum ultraviolet rays. In addition, the first processing gas supply unit supplies the first processing gas into the plasma generating space. With this configuration, ions generated from the first processing gas are blocked by the partition plate and only radicals generated from the first processing gas are moved into the substrate processing space and react with the reaction products.

In addition, the second processing gas supply unit supplies the second processing gas into the substrate processing space. The second processing gas reacts with the reaction products without being exposed to the plasma. Thus, owing to interaction between the radicals and the second reactant processing gas, it is possible to properly remove the reaction products generated when the etching target layer is etched.

The substrate processing apparatus may further include a gas exhaust unit which is provided to the substrate processing space and depressurizes the space of the processing chamber.

With this configuration, the radicals generated from the first processing gas can be properly moved into the substrate processing space. In addition, for example, when a reaction product is generated by reaction between the second processing gas and the reaction products, the generated reaction product can be exhausted without being decomposed by a plasma.

The partition plate may include at least two plate-shaped members arranged to overlap with each other from the plasma generating space toward the substrate processing space. Each plate-shaped member may have a plurality of through-holes penetrating therethrough in the overlapping direction. The through-holes of one of the at least two plate-shaped members preferably do not overlap with the through-holes of the other ones of the at least two plate-shaped members in the overlapping direction.

With this configuration, the radicals generated from the first processing gas can be moved into the substrate processing space while blocking ions and ultraviolet rays generated from the first processing gas by the partition plate.

The radicals may cause a reduction reaction, an oxidation reaction, a chloride reaction or a fluoride reaction. The first processing gas may contain hydrogen atoms, oxygen atoms, chlorine atoms or fluorine atoms.

From the reaction between these radicals and the reaction products, the reaction products can be changed into a substance which is easily react with the second processing gas.

The second processing gas may include a gas whose reaction with the reaction products is affected by a temperature of the mounting table. The second processing gas may include an electron-donating gas.

Thus, by supplying the second reactant processing gas into the substrate processing space not exposed to the plasma, the second processing gas can react with the reaction products without being dissociated.

In accordance with another aspect of the present invention, there is provided a substrate processing method for treating reaction products deposited in etching an etching target layer included in a target object by using a substrate processing apparatus.

The substrate processing apparatus includes a processing chamber defining a space; a partition plate which is disposed in the processing chamber and partitions the space into a plasma generating space and a substrate processing space, the partition plate being configured to suppress transmission of ions and vacuum ultraviolet rays; a plasma source configured to generate a plasma in the plasma generating space; and a mounting table disposed in the substrate processing space for mounting the target object thereon.

The substrate processing apparatus further includes a first processing gas supply unit configured to supply a first processing gas into the plasma generating space, the first processing gas to be dissociated by the plasma to generate radicals; and a second processing gas supply unit configured to supply a second processing gas into the substrate processing space, the second processing gas reacting with the reaction products without being exposed to the plasma.

The substrate processing method includes: a first step of generating the radicals by supplying the first processing gas from the first processing gas supply unit into the plasma generating space in which a plasma is generated, and moving the generated radicals into the substrate processing space to cause a reaction with the reaction products; and a second step of supplying the second processing gas from the second processing gas supply unit into the substrate processing space to cause a reaction with the reaction products.

In the substrate processing apparatus used in this method, the partition plate is disposed in the processing chamber whose space is partitioned into the plasma generating space and the substrate processing space by the partition plate. The partition plate transmits neural radicals while suppressing transmission of ions and vacuum ultraviolet rays. In addition, the first processing gas supply unit supplies the first processing gas into the plasma generating space. By performing the first step using the apparatus configured as above, ions generated from the first processing gas are blocked by the partition plate and only radicals generated from the first processing gas can be moved into the substrate processing space and react with the reaction products.

In addition, in the substrate processing apparatus executing this method, the second processing gas supply unit supplies the second processing gas into the substrate processing space. By performing the second step using the apparatus configured as above, the second processing gas can react with the reaction products without being exposed to plasma. Thus, owing to interaction between the radicals and the second reactant processing gas, it is possible to properly remove the reaction products generated when the etching target layer is etched.

The first step and the second step may be performed in the same substrate processing apparatus.

Thus, since reactions of the radicals and the second processing gas can be consistently performed in vacuum, it is possible to prevent new reaction products from being formed by processing.

The first step may be performed before or at the same time of the second step.

With this configuration, radicals can react with the reaction products so that the reaction products can be changed into a substance which is easily react with the second processing gas.

The etching target layer may include a metal-containing layer.

With this, even when the reaction products are so-called hardly-etched substances containing metal, metal oxide, metal halogen compounds or the like, it is possible to properly remove reaction products generated when the etching target layer is etched by interaction between the radicals and the second reactant processing gas.

Effect of the Invention

In accordance with the aspects of the present invention, it is possible to properly remove reaction products generated when an etching target layer is etched.

DETAILED DESCRIPTION OF THE EMBODIMENTS

Figure 1:
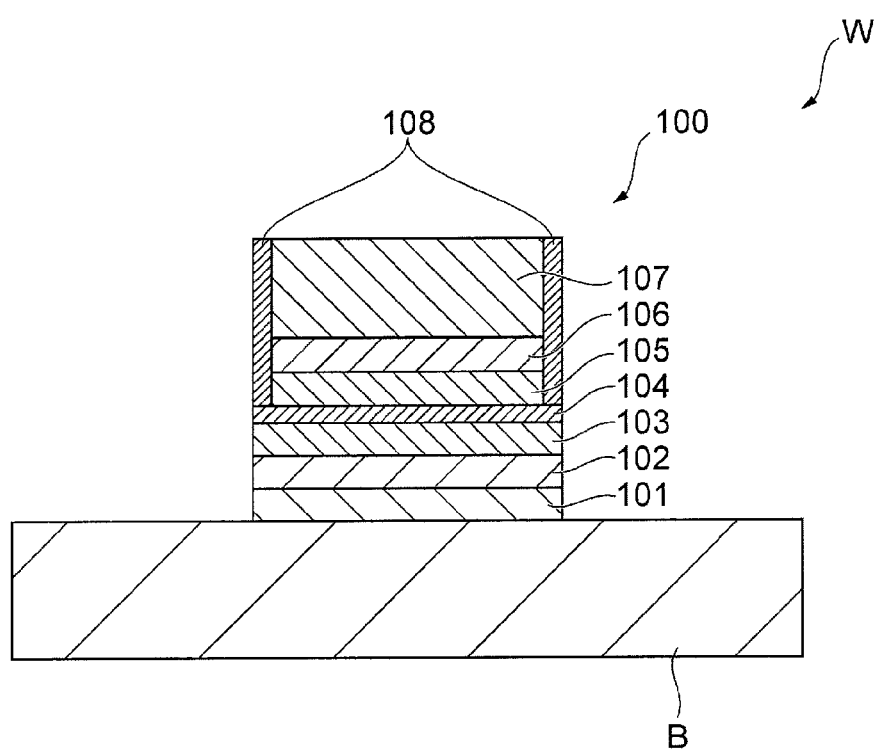
FIG. 1 is a view schematically showing one example of a MRAM device manufactured by a substrate processing method in accordance with one embodiment.

Hereinafter, embodiments of the present invention will be described in detail with reference to the accompanying drawings. Throughout the drawings, the like parts are denoted by like reference numerals.

FIG. 1 is a cross sectional view of a MRAM device 100 manufactured by a substrate processing method in accordance with an embodiment. Referring to FIG. 1, the MRAM device 100 is formed on a substrate B and includes a lower electrode 101, a pinning layer 102, a second magnetic layer 103, an insulation layer 104, a first magnetic layer 105, an upper electrode layer 106 and an etching mask 107, which are laminated in that order from the bottom. In addition, an insulation film 108 is formed on side walls of the first magnetic layer 105, the upper electrode layer 106 and the etching mask 107 of the MRAM device 100.

The lower electrode layer 101 is a conductive electrode member formed on the substrate B. The thickness of the lower electrode layer 101 is, e.g., about 5 nm. The pinning layer 102 is interposed between the lower electrode layer 101 and the second magnetic layer 103. The pinning layer 102 fixes a magnetization direction of the lower magnetic layer 101 by the pinning effect of an antiferromagnetic body. The pinning layer 102 is formed of an antiferromagnetic material such as, e.g., iridium manganese (IrMn), platinum manganese (PtMn) or the like and its thickness is, e.g., about 7 nm.

The second magnetic layer 103 includes a ferromagnetic material layer formed on the pinning layer 102. The second magnetic layer 103 acts as a so-called pinned layer whose magnetization direction remains constant by the pinning effect of the pinning layer 102 without being affected by an external magnetic field. The second magnetic layer 103 is formed of, e.g., CoFeB and its thickness is, e.g., about 2.5 nm.

The insulation layer 104 is interposed between the second magnetic layer 103 and the first magnetic layer 105. The interposition of the insulation layer 104 between the second magnetic layer 103 and the first magnetic layer 105 causes a tunnel magnetoresistance effect between the second magnetic layer 103 and the first magnetic layer 105. That is, electric resistance corresponding to the relationship (parallelism or antiparallelism) between the magnetization direction of the second magnetic layer 103 and the magnetization direction of the first magnetic layer 105 is generated between the second magnetic layer 103 and the first magnetic layer 105. The insulation layer 104 is formed of $Al_2O_3$ or MgO and its thickness is, e.g., 1.3 nm.

The first magnetic layer 105 includes a ferromagnetic layer formed on the insulation layer 104. The first magnetic layer 105 acts as a so-called free layer whose magnetization direction follows an external magnetic field which is magnetic information. The first magnetic layer 105 is formed of CoFeB and its thickness is, e.g., about 2.5 nm.

The upper electrode layer 106 is a conductive electrode member formed on the first magnetic layer 105. The thickness of the upper electrode layer 106 is, e.g., about 5 nm. The etching mask 107 is formed on the upper electrode layer 106. The etching mask 107 is shaped to correspond to a planar shape of the MRAM device 100. The etching mask 107 is formed of, e.g., Ta, TiN, Si, W, Ti or the like and its thickness is, e.g., 50 nm.

Figure 2:
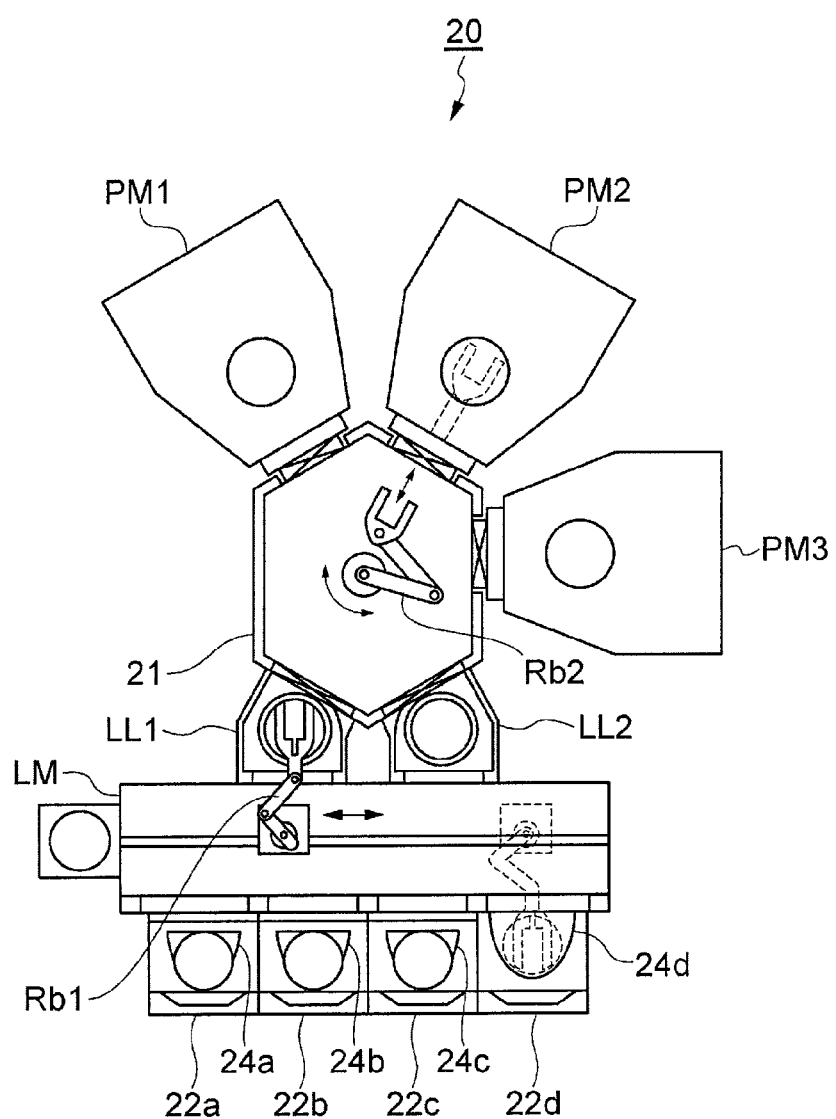
FIG. 2 is a schematic view of a substrate processing system including a substrate processing apparatus in accordance with one embodiment.

Next, a method for manufacturing the MRAM device 100 will be described. The MRAM device 100 is manufactured by, e.g., a substrate processing system shown in FIG. 2. FIG. 2 is a plan view schematically showing a substrate processing system in accordance with an embodiment. The substrate processing system 20 shown in FIG. 2 includes substrate stages 22a to 22d, containers 24a to 24d, a loader module LM, load-lock chambers LL1 and LL2, process modules PM1 to PM3 and a transfer chamber 21.

The substrate stages 22a to 22d are arranged along one side of the loader module LM. The containers 24a to 24d are mounted on the substrate stages 22a and 22d, respectively. Target objects W to be processed are accommodated in the containers 24a to 24d.

A transfer robot Rb1 is provided within the loader module LM. The transfer robot Rb1 takes out a target object W accommodated in one of the containers 24a to 24d and transfers it to the load-lock chamber LL1 or LL2.

The load-lock chambers LL1 and LL2 are arranged along another side of the loader module LM and serves as a preliminary vacuum chamber. The load-lock chambers LL1 and LL2 are connected to the transfer chamber 21 through respective gate valves.

The transfer chamber 21 is a chamber of which inner space can be depressurized and a transfer robot Rb2 is provided therein. The transfer chamber 21 is connected with the process modules PM1 to PM3 through respective gate valves. The transfer robot Rb2 takes the target object W out of the load-lock chamber LL1 or LL2 and transfers it to the process modules PM1, PM2 and PM3 sequentially. The process modules PM1, PM2 and PM3 of the substrate processing system 20 may be a substrate processing apparatus (a substrate processing apparatus for removing reaction products), a film forming apparatus and a plasma etching apparatus in accordance with the embodiment, respectively. The film forming apparatus may be a CVD (Chemical Vapor Deposition) apparatus. In the following description, for the sake of easy understandings of description, e.g., the process module PM1 is employed for a substrate processing apparatus for removing reaction products, the process module PM2 is employed for a film forming apparatus, and the process module PM3 is employed for a plasma etching apparatus.

Figure 3:
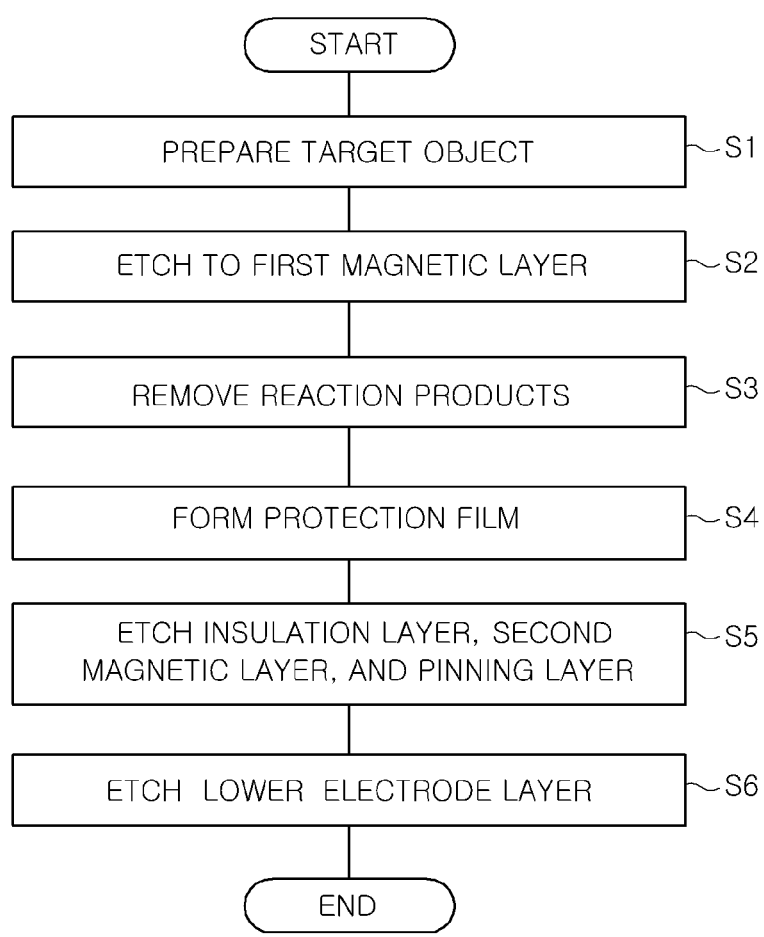
FIG. 3 is a flowchart showing the substrate processing method in accordance with the embodiment.
Figure 4:
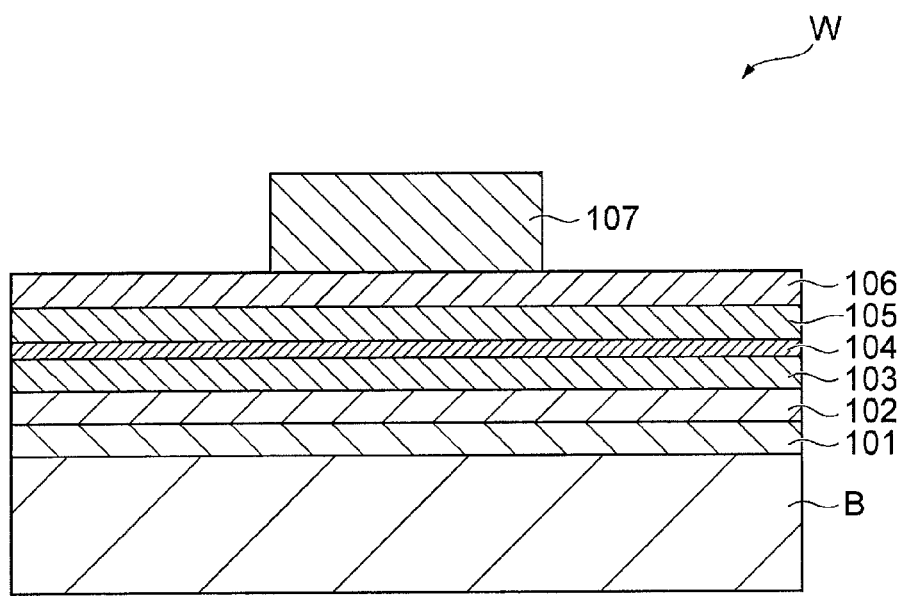
FIGS. 4 to 9 are views for presenting a process of manufacturing the MRAM device shown in FIG. 3.

The MRAM device 100 is manufactured according to, e.g., a flowchart shown in FIG. 3. FIG. 3 is a flowchart showing a substrate processing method in accordance with the embodiment. In the substrate processing method in accordance with the embodiment, as shown in FIG. 3, a multi-layered target object W is manufactured by the process module PM2 as the film forming apparatus at step S1. Next, the target object W is mounted on an electrostatic chuck in the process module PM3 as the plasma etching apparatus. FIG. 4 shows one example of the target object W manufactured in an intermediate step of the method for manufacturing the MRAM device 100. The target object W is a multi-layered material including the lower electrode layer 101, the pinning layer 102, the second magnetic layer 103, the insulation layer 104, the first magnetic layer 105 and the upper electrode layer 106 which are laminated on the substrate B. An etching mask 107 having a predetermined planar shape is disposed on the upper electrode layer 106.

Hereinafter, a substrate processing method in accordance with the embodiment will be described by way of an example of the target object W shown in FIG. 4.

At step S2, the upper electrode layer 106 is etched first. An etching gas used at this time is optional. For example, the etching gas may be $Cl_2$, $CH_4$, He, $N_2$, Ar or the like. For example, a processing gas containing chlorine ($Cl_2$) is supplied and a plasma is generated to etch the target object W. The processing gas may include an inert gas such as He, $N_2$, Ar or the like, and $H_2$. A kind of gas to achieve sufficient selectivity of the first magnetic layer 105 and the insulation layer 104 is employed as the processing gas. In step S2, a region of the first magnetic layer 105, which is not covered by the etching mask 107, reacts with and is etched by a first processing gas, but the insulation layer 104 is not etched. Thus, in step S2, the etching is completed at a surface of the insulation layer 104.

Figure 5:
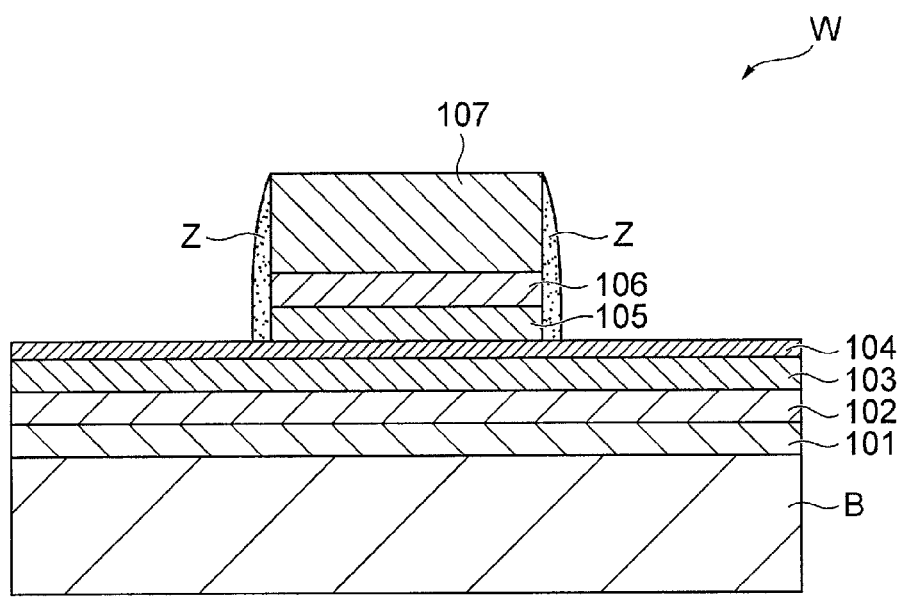

In step S2, when the first magnetic layer 105 is etched using the processing gas, a material to be etched reacts with the processing gas and a reaction product is generated. The reaction product may include metal which is contained in the mask 107 and the first magnetic layer 105, oxide, chloride, nitride or halide of the metal, a C or Si-containing compound or the like. The reaction product is adhered, as a residue Z, to side walls of the first magnetic layer 105, the upper electrode layer 106 and the etching mask 107, as shown in FIG. 5. The residue Z may cause a leak current in the MRAM because it contains a conductive substance.

Figure 6:
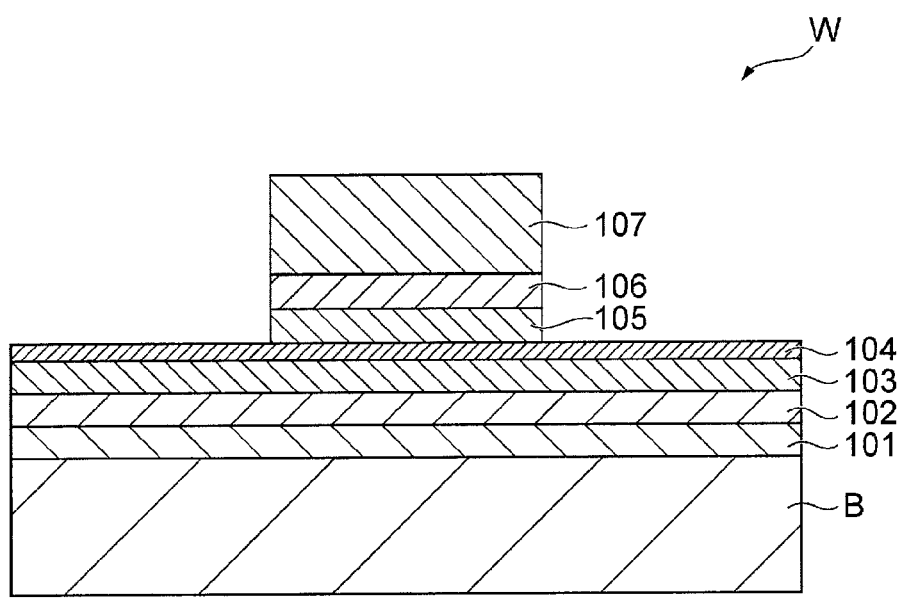

At step S3, in order to remove the residue Z, the target object W is transferred to the process module PM1 as the substrate processing apparatus in accordance with the embodiment. Step S3 will be described in detail later. After the residue Z is removed from the side walls of the first magnetic layer 105, the upper electrode layer 106 and the etching mask 107 as shown in FIG. 6, the process proceeds to step S4.

Figure 7:
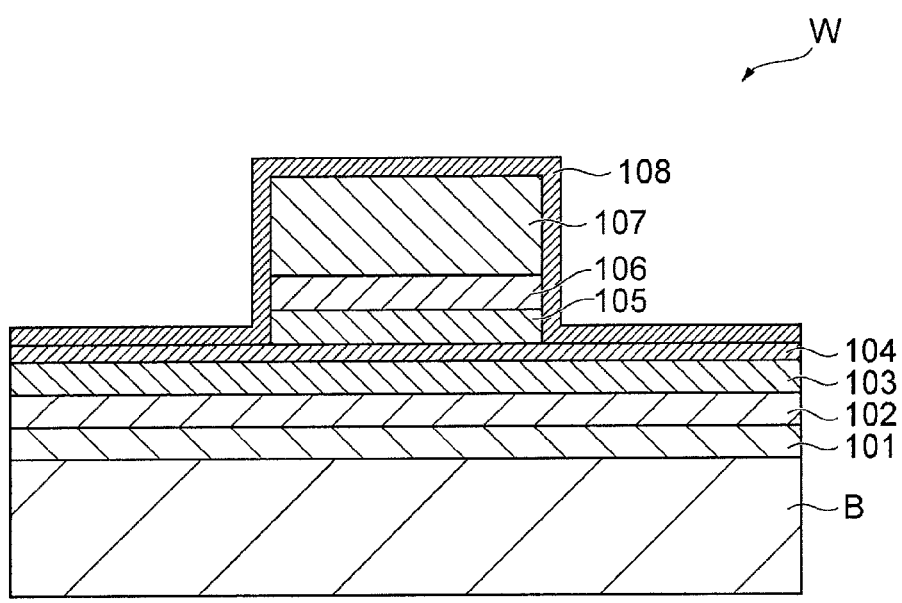

In the substrate processing method in accordance with the embodiment, at step S4, the target object W is transferred to the process module PM2 as the film forming apparatus (e.g., CVD apparatus) in which the surface of the target object W is coated with the insulation film 108 as shown in FIG. 7. The insulation film 108 is formed of, e.g., SiN or $SiO_2$. Thereafter, the target object W is returned to the process module PM3 as a plasma etching apparatus in which the insulation film 108 is etched such that the insulation film 108 is left at the side walls of the first magnetic layer 105, the upper electrode layer 106 and the etching mask 107.

Figure 8:
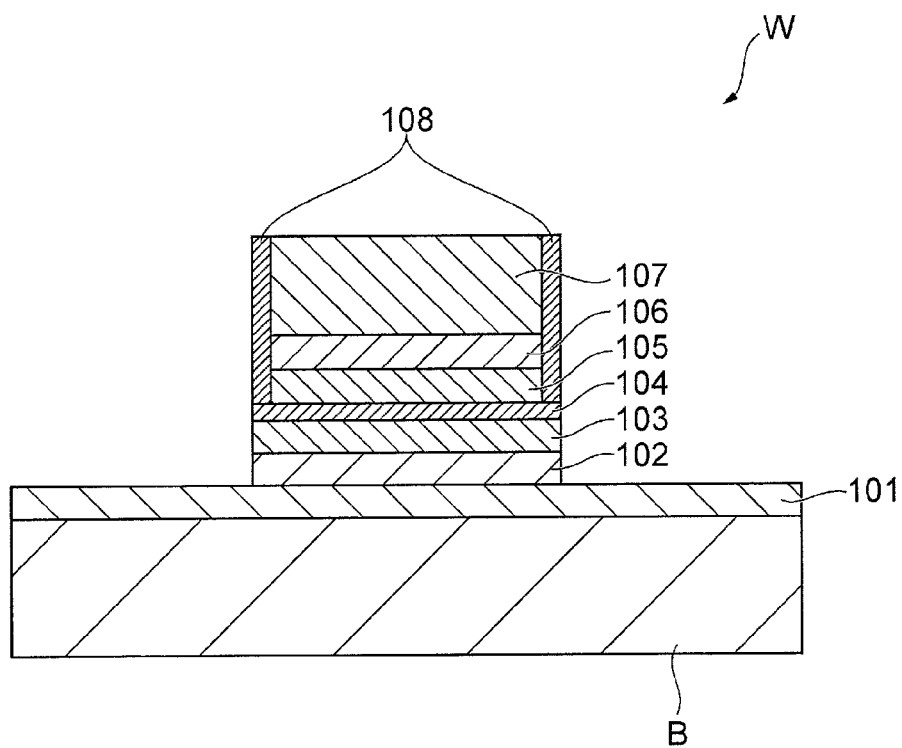

In the substrate processing method in accordance with the embodiment, at step S5, a processing gas such as a methane ($CH_4$)-containing gas is supplied to generate a plasma to etch the insulation layer 104, the second magnetic layer 103, and the pinning layer 102. The target object W etched in step S5 is shown in FIG. 8. The processing gas may include an inert gas such as He, $N_2$, Ar or the like, a carbonyl group-containing gas, $H_2$ and the like, in addition to the methane gas. In step S5, regions of the insulation layer 104, the second magnetic layer 103 and the pinning layer 102, which are not covered by the etching mask 107 and the insulation film 108, are etched. Thus, the pinning layer 102, the second magnetic layer 103 and the insulation layer 104 are formed to be wider than the width of the first magnetic layer 105, the upper electrode layer 106 and the etching mask 107 by the width of the insulation film 108 formed at the side walls of the first magnetic layer 105, the upper electrode layer 106 and the etching mask 107.

Figure 9:
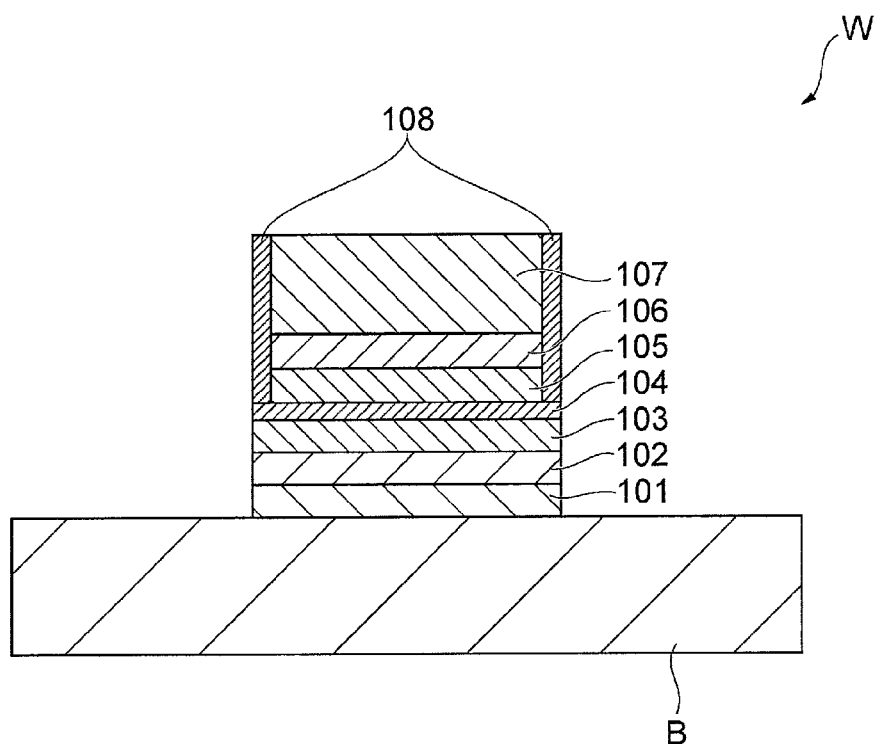

In the substrate processing method in accordance with the embodiment, at step S6, a processing gas is supplied to generate a plasma to etch the lower electrode layer 101. The target object W etched in step S6 is shown in FIG. 9. The processing gas may include an inert gas such as He, $N_2$, Ar or the like, a carbonyl group-containing gas, $CH_4$, $H_2$ and the like. In step S6, a region of the lower electrode layer 101, which is not covered by the etching mask 107 and the insulation film 108, is etched. Thus, the lower electrode 101 is formed to be wider than the width of the first magnetic layer 105, the upper electrode layer 106 and the etching mask 107 by the width of the insulation film 108 formed at the side walls of the first magnetic layer 105, the upper electrode layer 106 and the etching mask 107.

When step S6 is completed, the plasma processing shown in FIG. 3 is completed. Thus, a MRAM device having a desired shape is formed from the target object W having a multi-layer structure.

Figure 10:
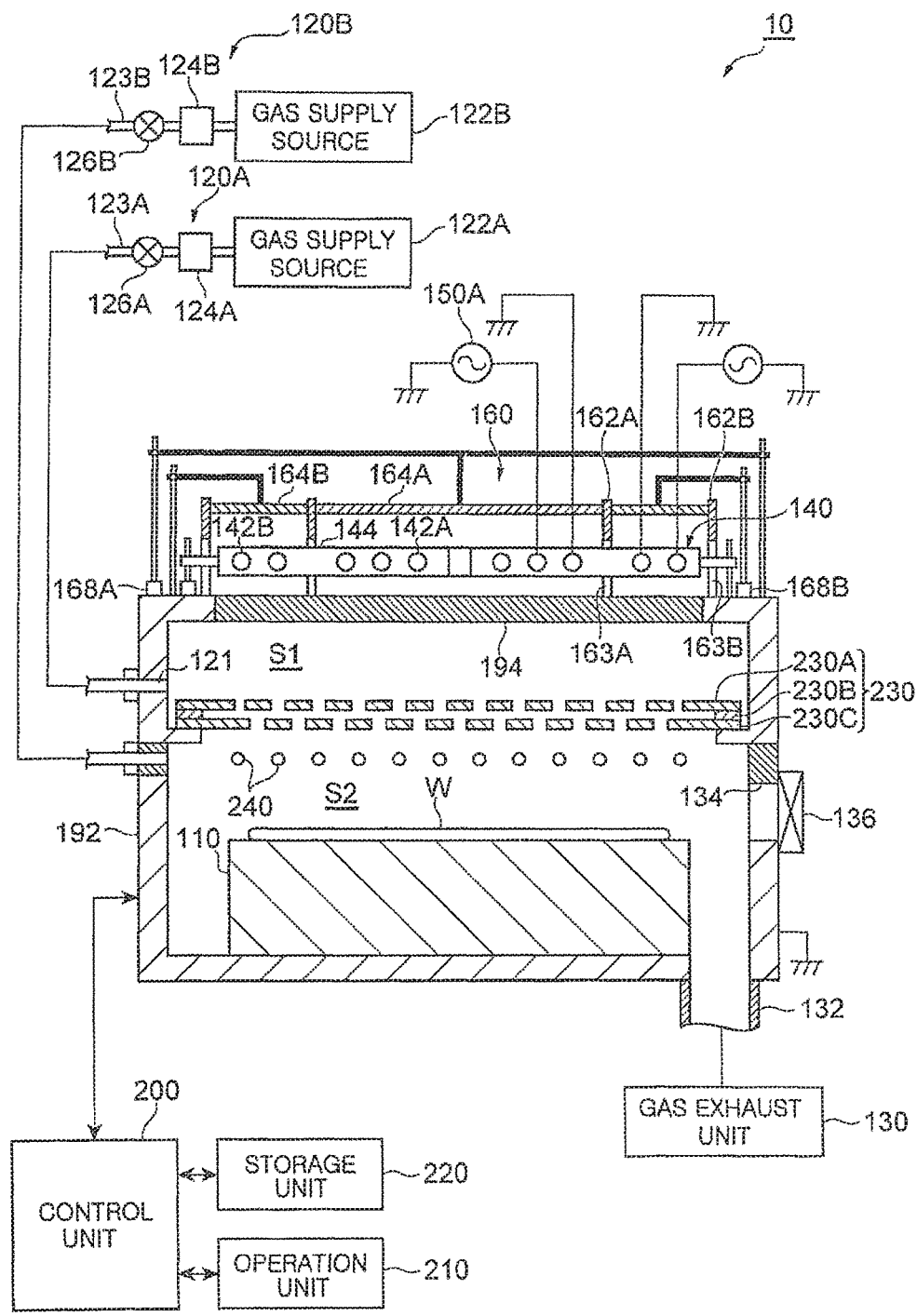
FIG. 10 is a schematic view of a substrate processing apparatus in accordance with one embodiment.
Figure 11:
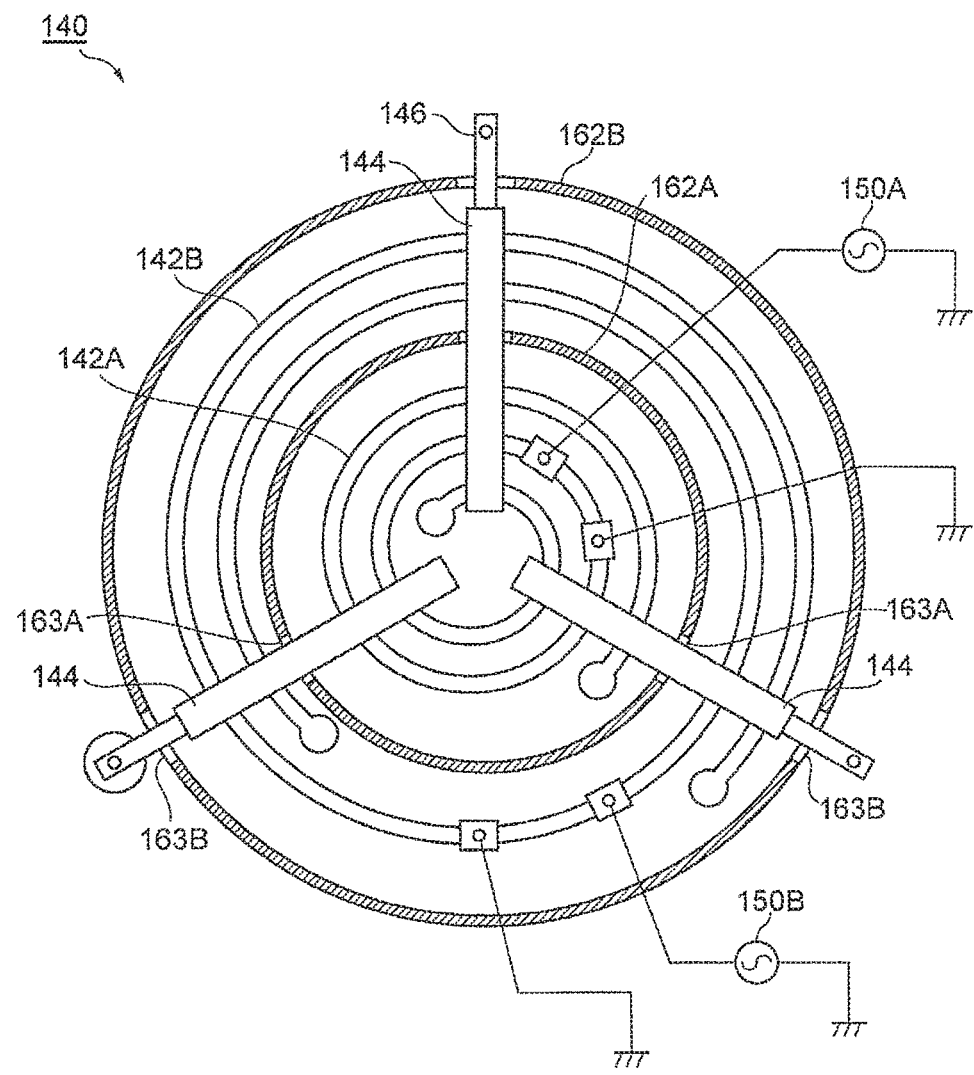
FIG. 11 is a plan view of a high frequency antenna shown in FIG. 10.

Next, a substrate processing apparatus used to remove reaction products in step S3 will be described. Here, an inductively coupled plasma processing apparatus is illustrated for plasma-processing a target object W (e.g., a semiconductor wafer (hereinafter, abbreviated as a "wafer")). The wafer W is processed by using a plasma of a processing gas excited in a processing chamber by applying an RF (Radio Frequency) power to a planar high frequency antenna. FIG. 10 is a schematic view showing a plasma processing apparatus 10 which can be used as the process module PM1 shown in FIG. 2, in accordance with the embodiment. FIG. 11 is a plan view of a high frequency antenna 140 shown in FIG. 10 when viewed from the top.

The plasma processing apparatus 10 includes e.g., cylindrical processing chamber 192 formed of a metal (e.g., aluminum). The processing chamber 192 has a space in its inside. The processing chamber 192 is not limited to the cylindrical shape. For example, the processing chamber 192 may have a square column shape (e.g., a box shape).

A mounting table 110 for mounting a wafer W is provided on the bottom of the processing chamber 192. The mounting table 110 has a columnar shape (e.g., a cylindrical columnar shape) and is formed of aluminum or the like. The mounting table 110 is not limited to the cylindrical shape. For example, the mounting table 110 may have a square columnar shape (e.g., polygonal columnar shape). Although not shown, the mounting table 110 may include an electrostatic chuck for attracting and holding the wafer W by a Coulomb force, a temperature adjustment mechanism such as a heater and a coolant passage, and the like to provide various functions, as necessary. Modifications of the mounting table 110 will be described in detail later.

A plate-shaped dielectric body 194 formed of, e.g., quartz glass, ceramics or the like is provided at a ceiling of the processing chamber 192 to face the mounting table 110. In detail, the plate-shaped dielectric body 194 has a circular plate shape and is air-tightly attached to the ceiling of the processing chamber 192 so that it closes an opening formed at the ceiling.

A partition plate 230 for partitioning a space into a plasma generating space S1 and a substrate processing space S2 is provided inside the processing chamber 192. The plasma generating space S1 is a space where a plasma is generated by a plasma source. The substrate processing space S2 is a space in which the wafer W is mounted. The partition plate 230 includes at least two plate-shaped members 230A and 230C. The two plate-shaped members 230A and 230C are arranged to overlap with each other from the plasma generating space S1 to the substrate processing space S2. A spacer 230B is interposed between the plate-shaped member 230A and the plate-shaped member 230C for maintaining a gap between the plate-shaped member 230A and the plate-shaped member 230C at a predetermined value.

Figure 12:
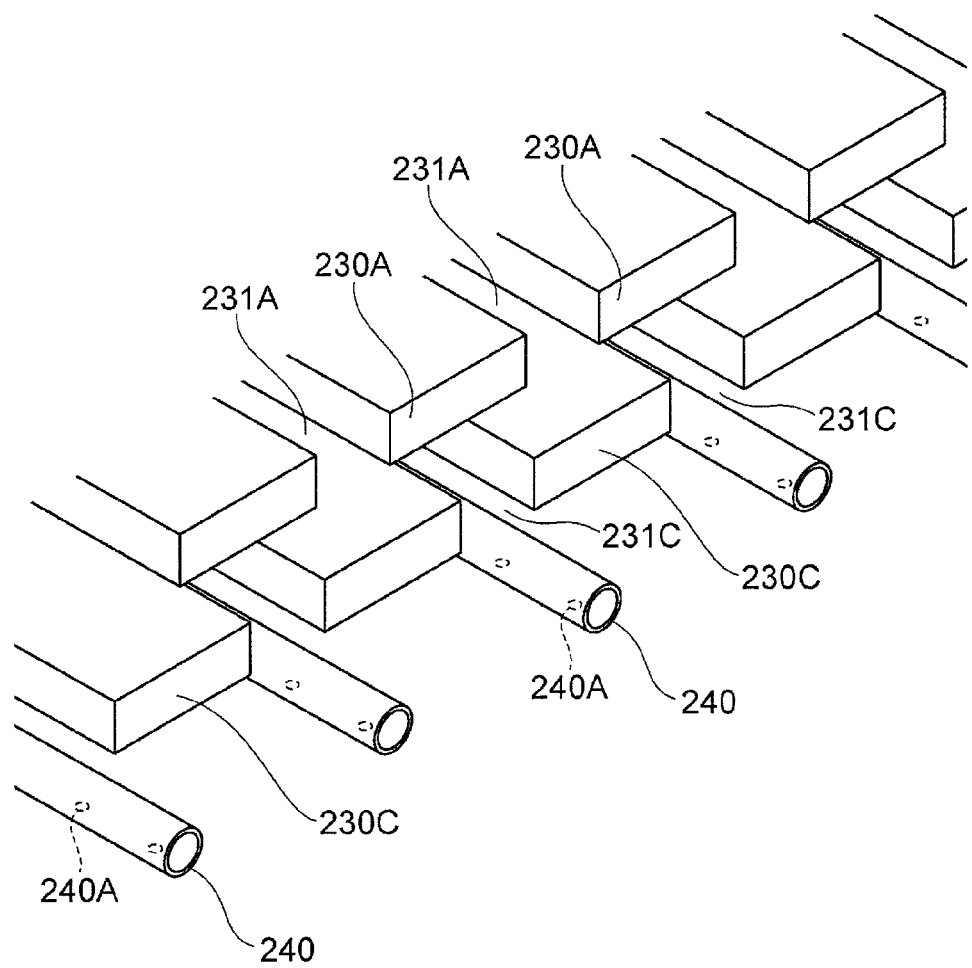
FIG. 12 is a schematic view for explaining second gas supply nozzles and the partition plate shown in FIG. 10.

FIG. 12 is a schematic view of the partition plate 230. As shown in FIG. 12, the plate-shaped members 230A and 230C respectively includes a plurality of slits 231A and a plurality of slits 231C penetrating therethrough in the overlapping direction. These slits are through-holes. Slits 231A in the plate-shaped member 230A are arranged not to overlap with slits 231C in the plate-shaped member 230C when viewed from the overlapping direction. The plate-shaped members 230A and 230C are made of, e.g., quartz glass. The spacer 230B is made of, e.g., Al. The partition plate 230 for partitioning the plasma generating space S1 and the substrate processing space S2 functions as a so-called ion trap for suppressing transmission of ions and vacuum ultraviolet ray.

A first gas supply unit 120A for supplying a first processing gas is connected to the processing chamber 192. The first gas supply unit 120A supplies the first processing gas into the plasma generating space S1. A gas inlet 121 is provided in a side wall of the processing chamber 192 and a gas supply source 122A is connected to the gas inlet 121 through a gas supply line 123A. A flow rate controller (e.g., a mass flow controller) 124A for controlling a flow rate of the first processing gas and an on-off valve 126A are disposed in the midway of the gas supply line 123A. With the gas supply unit 120A, the first processing gas from the gas supply source 122A is controlled to have a specific flow rate by the mass flow controller 124A and is supplied into the plasma generating space S1 of the processing chamber 192 through the gas inlet 121.

The first processing gas is decomposable and, thus, it is dissociated to generate radicals by a plasma generated by the plasma source. The radicals may cause reduction reaction, oxidation reaction, chloride reaction or fluoride reaction. The first processing gas may be a gas containing hydrogen atoms, oxygen atoms, chlorine atoms or fluorine atoms. Specifically, the first processing gas may be Ar, $N_2$, $O_2$, $H_2$, He, $BCl_3$, $Cl_2$, $CF_4$, $NF_3$, $CH_4$ or $SF_6$. The first processing gas which generates radicals for reduction reaction may be $H_2$ or the like. The first processing gas which generates radicals for oxidation reaction may be $O_2$ or the like. The first processing gas which generates radicals for chloride reaction may be $BCl_3$, $Cl_2$ or the like. The first processing gas which generates radicals of fluoride reaction may be $CF_4$, $NF_3$, $SF_6$ or the like.

A second gas supply unit 120B for supplying a second processing gas or the like is connected to the processing chamber 192. The second gas supply unit 120B supplies the second processing gas into the substrate processing space S2. A gas supply head 240 is disposed in the substrate processing space S2 of the processing chamber 192 and a gas supply source 122B is connected to the gas supply head 240 through a gas supply line 123B. FIG. 12 shows the gas supply head 240 disposed below the partition plate 230. The gas supply head 240 includes a plurality of gas holes 240A opened downward (i.e., toward the mounting table 110). In this manner, as the gas flows downward, the second reactant processing gas can be appropriately supplied onto the wafer W. The gas holes 240A may be opened upward (i.e., toward the partition plate 230). In this case, radicals transmitting through the partition plate 230 can be appropriately mixed with the second processing gas. A flow rate controller (e.g., a mass flow controller (MFC)) 124B for controlling a flow rate of the second processing gas and an on-off valve 126B are disposed in the midway of the gas supply line 123B. With this gas supply unit 120B, the second processing gas from the gas supply source 122B is controlled to have a specific flow rate by the mass flow controller 124B and is supplied into the substrate processing space S2 of the processing chamber 192 through the gas supply head 240.

The second processing gas is a reactant gas which reacts with a reaction product without being exposed to a plasma. The second processing gas may include a gas whose reaction with the reaction product is affected by a temperature of the mounting table 110, such as HF, $Cl_2$, HCl, $H_2O$, $PF_3$, $F_2$, $ClF_3$, $COF_2$, cyclopentadiene, amidinate or the like. The second processing gas may also include an electron-donating gas. The electron-donating gas refers generally to a gas composed of atoms having a large difference in terms of electronegativity or ionization potential or a gas composed of atoms having unshared electron pairs. The electron-donating gas has a property of easily donating electrons to other compounds. For example, the electron-donating gas has a property of bonding as a ligand with a metal compound. The electron-donating gas may include $SF_6$, $PH_3$, $PF_3$, $PCl_3$, $PBr_3$, $PI_3$, $CF_4$, $AsH_3$, $SbH_3$, $SO_3$, $SO_2$, $H_2S$, $SeH_2$, $TeH_2$, $Cl_3F$, $H_2O$, $H_2O_2$, a carbonyl group-containing gas or the like.

Although it is shown in FIG. 10 that the gas supply units 120A and 120B are presented by a gas line of a single system for the purpose of simplification of description, the gas supply units 120A and 120B are not limited to supply of a processing gas of a single gas species but may supply a plurality of gas species as processing gases. In this case, a plurality of gas supply sources may be provided with gas lines of multiple systems. Although it is illustrated in FIG. 10 that the gas supply unit 120A is configured to supply a gas from the side wall of the processing chamber 192, the gas supply unit 120A is not limited thereto. For example, a gas may be supplied from the ceiling of the processing chamber 192. In this case, e.g., a gas inlet may be formed in the center of the plate-shaped dielectric body 194 and the gas may be supplied from the gas inlet.

A gas exhaust unit 130 for exhausting the internal atmosphere of the processing chamber 192 is connected to the bottom of the processing chamber 192 through a gas exhaust passage 132. The gas exhaust unit 130 is formed with, e.g., a vacuum pump and can depressurizes the interior of the processing chamber 192 to a predetermined pressure. In addition, radicals generated in the plasma generating space S1 move into the substrate processing space S2 through the partition plate 230 by a difference in pressure between the plasma generating space S1 and the substrate processing space S2 which is caused by the gas exhaust unit 130.

A wafer loading/unloading port 134 is provided at the side wall of the processing chamber 192 and a gate valve 136 is provided at the wafer loading/unloading port 134. For example, when the wafer W is loaded, the gate valve 136 is opened to mount the wafer W on the mounting table 110 in the processing chamber 192 by a transfer mechanism (not shown) such as a transfer arm or the like and the gate valve 136 is closed to process the wafer W.

On the ceiling of the processing chamber 192, the planar high frequency antenna 140 and a shield member 160 covering the high frequency antenna 140 are disposed on a top surface (outer surface) of the plate-shaped dielectric body 194. The high frequency antenna 140 in accordance with the present embodiment is configured with, roughly, an inner antenna element 142A disposed to correspond to the central portion of the plate-shaped dielectric body 194 and an outer antenna element 142B disposed to surround the periphery of the inner antenna element 142A. Each of the antenna elements 142A and 142B is formed in a spiral coil made of a conductor such as steel, aluminum, stainless steel or the like.

The antenna elements 142A and 142B are embedded between a plurality of clamping bodies 144 to be one unit. Each of the clamping bodies 144 has a columnar shape as shown in FIG. 11 and the clamping bodies 144 are radially disposed and extend from the vicinity of center of the inner antenna element 142A to the outside of the outer antenna element 142B. FIG. 11 shows an example where each of the antenna elements 142A and 142B is embedded between three clamping bodies 144.

The shield member 160 includes a cylindrical inner shield wall 162A disposed between the antenna elements 142A and 142B to surround the inner antenna element 142a and a cylindrical outer shield wall 162B disposed to surround the outer antenna element 142B. Thus, the top surface of the plate-shaped dielectric body 194 is divided into a central portion (center zone) inside the inner shield wall 162A and a peripheral portion (peripheral zone) between the shield walls 162A and 162B.

A disc-shaped inner shield plate 164A is disposed on the inner antenna element 142A to close an opening of the inner shield wall 162A. A doughnut-shaped outer shield plate 164B is disposed on the outer antenna element 142B to close an opening between the shield walls 162A and 162B.

The shield member 160 is not limited to the cylindrical shape. The shield member 160 may have other shapes such as a square column shape, preferably a shape corresponding to the shape of the processing chamber 192. Here, since the processing chamber 192 has a cylindrical shape, the shield member 160 also has a cylindrical shape accordingly. If the processing chamber 192 has a square column shape, the shield member 160 may also have a square column shape.

RF power supplies 150A and 150B are respectively connected to the antenna elements 142A and 142B. Accordingly, RF powers of the same frequency or different frequencies can be applied to the antenna elements 142A and 142B. For example, when a specific RF power of a predetermined frequency (e.g., 40 MHz) is applied from the RF power supply 150A to the inner antenna element 142A, a processing gas introduced into the processing chamber 192 is excited by an induced magnetic field formed in the processing chamber 192 to generate a doughnut-like plasma in the central portion of the wafer W.

In addition, when a specific RF power of a predetermined frequency (e.g., 60 MHz) is applied from the RF power supply 150B to the outer antenna element 142B, a processing gas introduced into the processing chamber 192 is excited by an induced magnetic field formed in the processing chamber 192 to generate another doughnut-like plasma in the peripheral portion of the wafer W.

Radicals are generated from the first processing gas by the plasma. The RF powers outputted from the RF power supplies 150A and 150B are not limited to the above-mentioned frequencies. For example, RF powers of frequencies such as 13.56 MHz, 27 MHz, 40 MHz, 60 MHz and the like may be applied. However, there is a need to adjust an electrical length of each of the antenna elements 142A and 142B depending on the RF powers outputted from the RF power supplies 150A and 150B. In addition, heights of the inner shield plate 164A and the outer shield plate 164B can be adjusted by actuators 168A and 168B, respectively.

The plasma processing apparatus 10 is connected with a control unit 200 to control the components of the plasma processing apparatus 10. The control unit 200 is connected with an operation unit 210 including a keyboard that is used for an operator to input commands to manage the plasma processing apparatus 10, a display for visually displaying an operation status of the plasma processing apparatus 10 and the like.

The control unit 200 is also connected with a storage unit 220 that stores programs for realizing various processes executed in the plasma processing apparatus 10 under control of the control unit 200, recipe data for executing the programs, and the like.

The storage unit 220 stores process recipes for executing processes of the wafer W, recipes for executing required processes, e.g., cleaning of the processing chamber 192 and the like. These recipes are an integration of various parameters including control parameters for control of the components of the plasma processing apparatus 10, setting parameters and the like. For example, the process recipes include parameters such as flow rates of processing gases, an internal pressure of the processing chamber 192, frequencies and powers of RF signals applied to the antenna elements 142A and 142B, and the like.

These recipes may be stored in a hard disk or a semiconductor memory, or may also be stored in a portable computer-readable storage medium such as CD-ROM, DVD or the like and set in a predetermined location of the storage unit 220.

The control unit 200 executes a desired process in the plasma processing apparatus 10 by reading out a desired processing recipe from the storage unit 220 in accordance with an instruction from the operation unit 210 and controlling the components of the apparatus 10. In addition, the recipes can be edited according to a manipulation by an operator through the operation unit 210.

Figure 13:
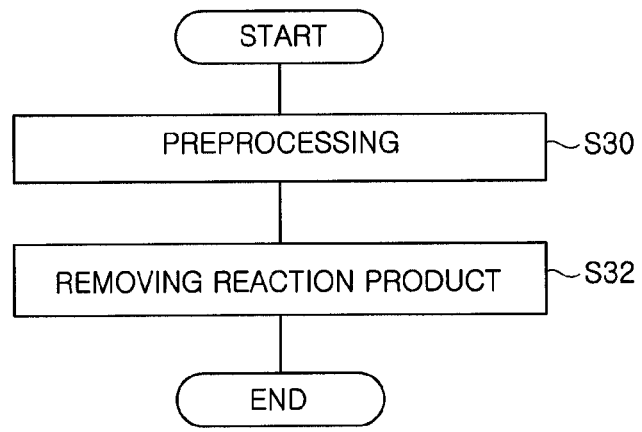
FIG. 13 is a flowchart for explaining details of a reaction product removing process.

The above-described plasma processing apparatus 10 is used to remove reaction products. FIG. 13 is a flowchart for explaining details of step S3 shown in FIG. 3. Since the reaction products may include metal contained in the mask 107 and the first magnetic layer 105, oxide, chloride, nitride or halide of the metal, a C or Si-containing compound or the like, as described earlier, the reaction products cannot be removed only with radicals or reactant gases. Therefore, the reaction products are pre-treated to be easily removed in step S30 (first processing step) and, subsequently or simultaneously, the reaction products are removed in step S32 (second processing step). That is, the pre-treatment is a process of treating surfaces of the reaction products with radicals so that the reaction products can be easily removed in step S32. In step S30, the first processing gas described above is used. The first processing gas is determined depending on the reaction products and a gas to remove the reaction products in step S32.

For example, when the reaction products contain metal, metal oxide, Si or $SiO_2$, $PF_3$ may be used as the second processing gas to remove the reaction products. $PF_3$ is coordinate bonded to metal or a compound, peeled off, evaporated and exhausted. Here, $PF_3$ has a property of coordinate bonding to neutral metal and evaporating. Therefore, in order to efficiently remove the reaction products using $PF_3$, pre-treatment for reducing the metal oxide is performed. For example, $H_2$ is used as the first processing gas. $H_2$ is supplied into the plasma generating space S1 and hydrogen radicals are generated by a plasma. The hydrogen radicals thus generated pass through the partition plate 230 to move into the substrate processing space S2 and reduce the metal oxide to metal. Subsequently or simultaneously, $PF_3$ is supplied to be coordinate bonded to metal, evaporated and exhausted.

In addition, e.g., when the reaction products contain metal, cyclopentadiene may be used as the second processing gas to remove the reaction products. Cyclopentadiene reacts with ionized metal (substitution reaction) to produce a compound, evaporated and exhausted. Therefore, in order to efficiently remove the reaction products using cyclopentadiene, pre-treatment for ionizing metal is performed. For example, a gas which generates radicals for chloride reaction, such as $Cl_2$, is used as the first processing gas. $Cl_2$ is supplied into the plasma generating space S1 and generates chloride radicals by a plasma. The chloride radicals thus generated pass through the partition plate 230 to move into the substrate processing space S2 and react with metal to produce metal chloride. Subsequently or simultaneously, cyclopentadiene is supplied to react with metal chloride, evaporated and exhausted.

In addition, e.g., when the reaction products contain Si, HF may be used as the second processing gas to remove the reaction products. HF is suitable to ash $SiO_2$. Therefore, in order to efficiently remove the reaction products using HF, pre-treatment for oxidizing Si is performed. For example, a gas which generates radicals for oxidation reaction, such as $O_2$, is used as the first processing gas. $O_2$ is supplied into the plasma generating space S1 and generates oxygen radicals by a plasma. The oxygen radicals thus generated pass through the partition plate 230 to move into the substrate processing space S2 and react with Si to produce $SiO_2$. Subsequently or simultaneously, HF is supplied to ash $SiO_2$.

By repeating the above-described steps S30 and S32, the surfaces of the reaction products are treated by radicals and the reaction products are removed. Steps S30 and S32 may be performed simultaneously.

As described above, in the plasma processing apparatus 10 in accordance with the present embodiment, the partition plate 230 is placed within the processing chamber 192 to partition the internal space of the processing chamber 192 into the plasma generating space S1 and the substrate processing space S2. The partition plate 230 transmits neutral radicals while preventing transmission of ions and vacuum ultraviolet rays. In addition, the first processing gas supply unit 122A supplies the first processing gas into the plasma generating space S1. With this configuration, ions generated from the first processing gas are blocked by the partition plate 230 and only radicals generated from the first processing gas are moved into the substrate processing space S2 and react with the reaction products. In other words, only radicals required for treatment of the reaction products can be taken while minimizing substrate damage due to ions.

In addition, the second processing gas supply unit 122A supplies the second processing gas into the substrate processing space S2. Therefore, the second processing gas reacts with the reaction products without being exposed to a plasma. Thus, owing to interaction between the radicals and the second reactant processing gas, it is possible to properly remove reaction products generated when an etching target film is etched. Since the compound coordinate bonded with the above-mentioned $PF_3$ or cyclopentadiene is dissociated when it is exposed to a plasma, it is difficult to efficiently peel metal off by using an electron-donating gas under a plasma irradiation environment. However, in the plasma processing apparatus 10 in accordance with the present embodiment, since a plasma is blocked by the partition plate 230, a compound coordinate bonded with $PF_3$ or cyclopentadiene is not dissociated. Therefore, reaction products generated when an etching target film is etched can be properly removed.

In addition, in the plasma processing method in accordance with the present embodiment, by performing the pre-treatment of step S30, only radicals generated from the first processing gas can be moved into the substrate processing space S2 to react with the reaction products. In addition, by performing step S32, the second processing gas can react with the reaction products without being exposed to a plasma. Thus, owing to interaction between the radicals and the second reactant processing gas, it is possible to properly remove reaction products generated when a film is etched. In addition, since reactions of the radicals and the second processing gas can be consistently performed in a vacuum, it is possible to prevent new reaction products from being formed by processing. In addition, radicals react with the reaction products so that the reaction products can be changed into a substance which is easily react with the second processing gas. Thus, due to interaction between the radicals and the second reactant processing gas, it is possible to properly remove reaction products generated when an etching target film is etched.

In the above, the present invention has been described in detail by way of the embodiments. However, the present invention is not limited to the disclosed embodiments. It is to be understood that various modifications may be made without departing from the scope of the invention.

For example, any of the lower electrode layer 101, the pinning layer 102, the second magnetic layer 103, the insulation layer 104, the first magnetic layer 105, the upper electrode layer 106 and the etching mask 107 may have a multi-layer structure.

For example, the pre-treatment step S30 need not be necessarily performed. That is, the pre-treatment may not be performed depending on the type of reaction products and/or the type of the second processing gas. For example, the reaction products are assumed to contain C or metal such as Ti or W. In the respective cases, $O_2$ may be used as the second processing gas for removing C, $Cl_2$ or $BCl_2$ may be used as the second processing gas for removing Ti, and $NF_3$, $SF_6$ or $CF_4$ may be used as the second processing gas for removing W. For these processes, step S32 may be performed without performing the pre-treatment. In addition, after step S32, the subsequent steps such as recovery and observation may be properly performed.

In addition, although it has been described in the above embodiments that so-called ICP (Inductively Coupled Plasma) is used as a plasma source. However, the plasma source is not limited thereto, and a plasma source of an electron density of an order of $10^{10}$ to $10^{12}$, e.g., ECR (Electron Cyclotron Resonance) or a microwave, may be used. A plasma source such as CCP (Capacitively Coupled Plasma) may be also used.

TEST EXAMPLES

The present invention will be described in more detail by way of Test Examples and a Comparative Example. However, it is to be understood that the present invention is not limited to the following Test Examples.

Comparative Example 1

Figure 14A:
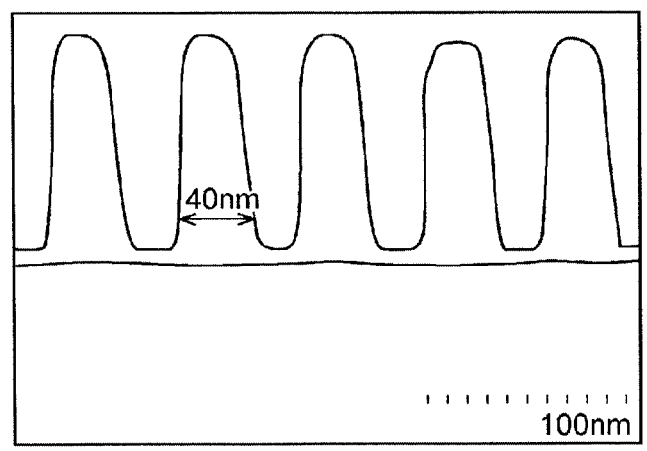
FIGS. 14A and 14B are schematic views of cross-sectional SEM images of a target object obtained in a comparative example.
Figure 14B:
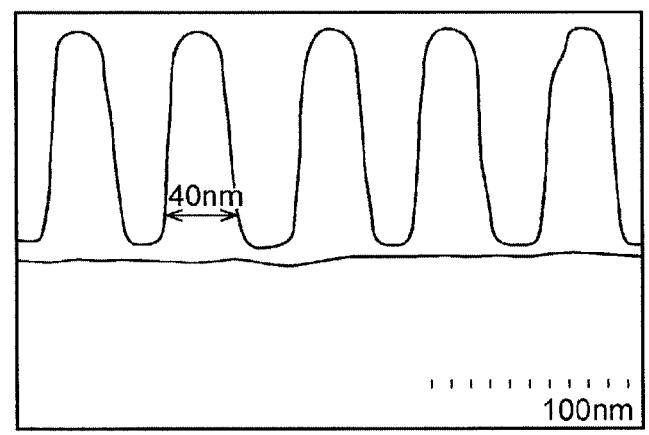

In Comparative Example 1, a wafer W which was etched from the top surface of the wafer W to the top surface of the insulation layer 104 as shown in FIG. 5 was observed as an initial state with an electron microscope. In addition, a state after supplying a $HF/CH_3$ gas to cause reaction between the gas and reaction products was observed with the electron microscope. FIG. 14A is a schematic view of a SEM (Scanning Electron Microscope) image before removal of the reaction products (the initial state) and FIG. 14B is a schematic view of a SEM image after supplying the $HF/CH_3$ gas. As shown in FIGS. 14A and 14B, it was confirmed that bottom widths (Btm CD (Critical Dimension)) of the MRAM element were 40 nm with no change before and after processing with the $HF/CH_4$ gas. That is, it was confirmed that the reaction products generated by etching of a metal-containing layer could not be removed only with the reaction gas.

Test Example 1

In Test Example 1, the wafer W in FIG. 4 as an initial state was etched from the top surface of the wafer W to the top surface of the insulation layer 104 and was observed with an electron microscope. In addition, a state after removing reaction products by the plasma processing apparatus 10 shown in FIG. 10 was observed with the electron microscope. In Test Example 1, $BCl_3$ and Ar were used as the first processing gas and HF was used as the second processing gas. Details are as shown below.

Space pressure: 1 Torr (133 Pa)
Power of plasma source: 300 W
$BCl_3$ gas: 280 sccm
Ar gas: 300 sccm
HF gas: 2000 sccm
Processing time: 180 seconds
Substrate temperature: 150° C.

Figure 15C:
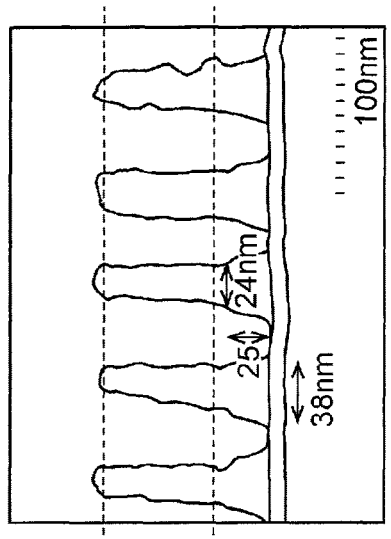
FIGS. 15A to 15C are schematic views of cross-sectional SEM images of a target object obtained in a first test example.
Figure 15B:
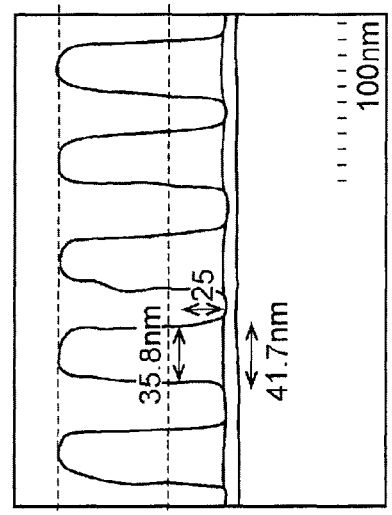
Figure 15A:
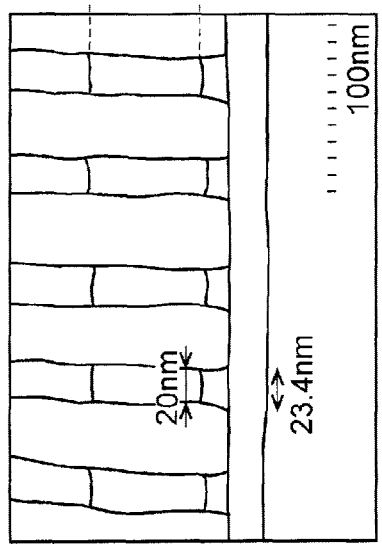
Figure 16A:
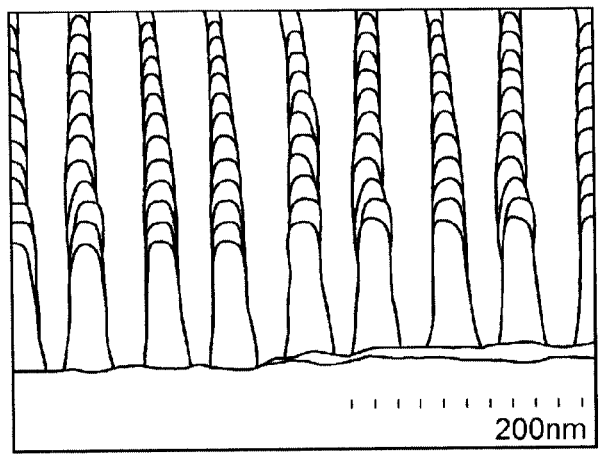
FIGS. 16A and 16B are schematic views of SEM images of the target object obtained in the first test example.
Figure 16B:
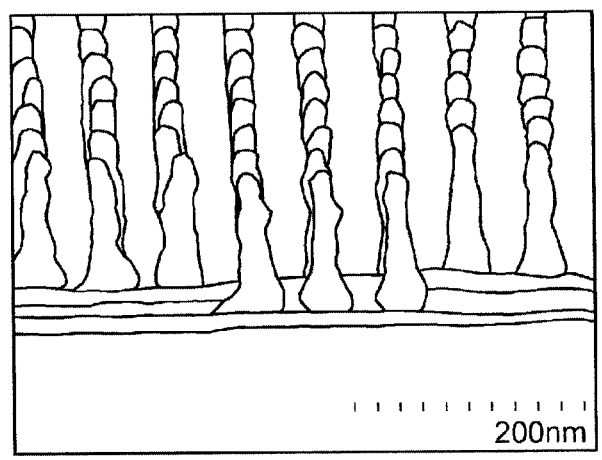

FIG. 15A shows a schematic view of a cross-sectional SEM image of the initial state of Test Example 1. FIG. 15B illustrates a schematic view of a cross-sectional SEM image of a state of etching from the top surface of the wafer W to the top surface of the insulation layer 104. FIG. 15C presents a schematic view of a cross-sectional SEM image of a state after removing reaction products by the plasma processing apparatus 10 shown in FIG. 10. FIG. 16A is a schematic view of a SEM image of a state of etching from the top surface of the wafer W to the top surface of the insulation layer 104. FIG. 16B is a schematic view of a cross-sectional SEM image of a state after removing the reaction products by the plasma processing apparatus 10 shown in FIG. 10.

As shown in FIGS. 15A and 15B, it was confirmed that Btm CD was changed from 23.4 nm to 35.8 nm. This is because reaction products were adhered by the etching. In addition, as shown in FIGS. 15B to 16B, it was confirmed that reaction products were removed and Btm CD was changed from 35.8 nm to 24 nm which is substantially equal to the initial value. Thus, it was confirmed that reaction products can be properly removed by the plasma processing apparatus 10 shown in FIG. 10.

Test Example 2

In Test Example 2, the wafer W in FIG. 4 as an initial state was etched from the top surface of the wafer W to the top surface of the insulation layer 104 and was observed with an electron microscope. In addition, a state after removing reaction products with a liquid of HF (5%) and $PF_3$ was observed with the electron microscope. Details are as shown below.

Space pressure: 20 Torr (2660 Pa)
Power of plasma source: 0 W (Non-Plasma)
$PF_3$ gas: 25 sccm
Processing time: 1800 seconds
Substrate temperature: 250° C.

Figure 17A:
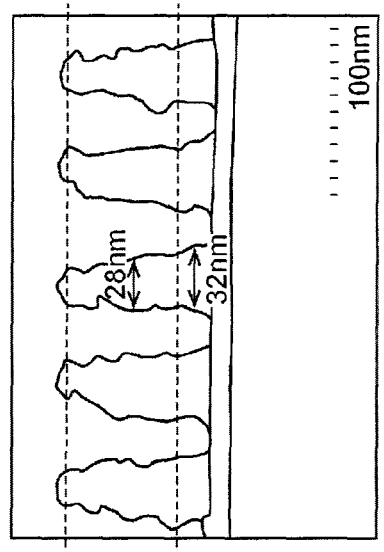
FIGS. 17A to 17C are schematic views of cross-sectional SEM images of a target object obtained in a second test example.
Figure 17B:
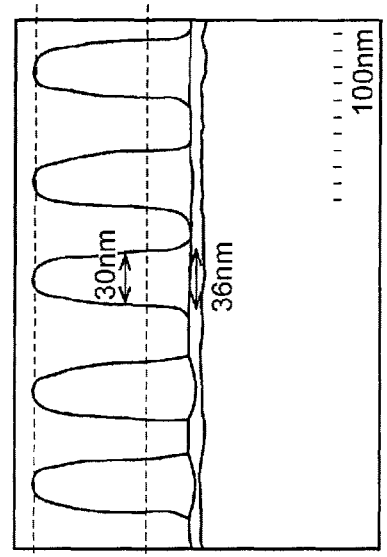
Figure 17C:
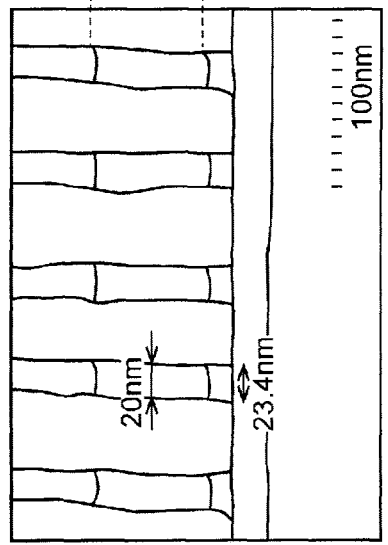
Figure 18A:
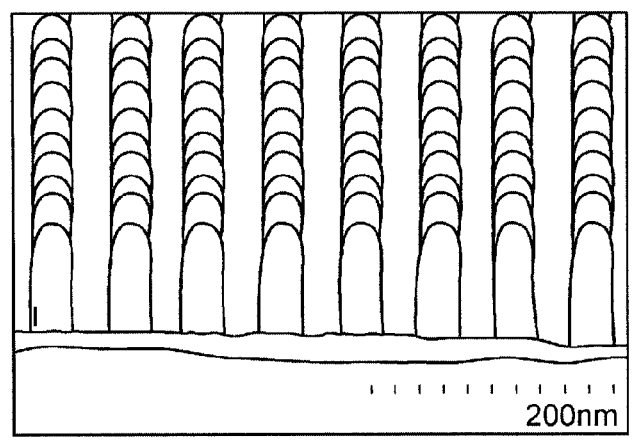
FIGS. 18A and 18B are schematic views of SEM images of the target object obtained in the second test example.
Figure 18B:
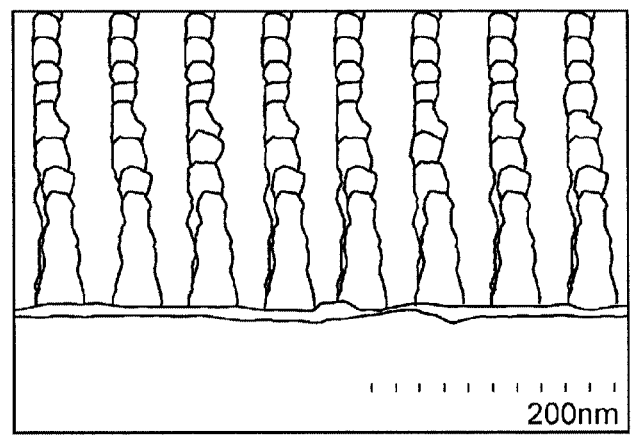

FIG. 17A is a schematic view of a cross-sectional SEM image of the initial state of Test Example 2. FIG. 17B is a schematic view of a cross-sectional SEM image of a state of etching from the top surface of the wafer W to the top surface of the insulation layer 104. FIG. 17C is a schematic view of a cross-sectional SEM image of a state after removing reaction products. FIG. 18A is a schematic view of a SEM image of a state of etching from the top surface of the wafer W to the top surface of the insulation layer 104. FIG. 18B is a schematic view of a cross-sectional SEM image of a state after removing reaction products.

As shown in FIGS. 17A and 17B, it was confirmed that Btm CD was changed from 23.4 nm to 30 nm. This is because reaction products were adhered by the etching. In addition, as shown in FIGS. 17B to 18B, it was confirmed that reaction products were removed and Btm CD was changed from 30 nm to 28 nm. Thus, it was confirmed that reaction products could be properly removed.

| Description of Reference Numerals | | | |
|---|---|---|---|
| 10 | plasma processing apparatus (substrate processing apparatus) | | |
| 20 | substrate processing system | | |
| 100 | MRAM device | 101 | lower electrode layer |
| 102 | pinning layer | 103 | second magnetic layer |
| 104 | insulation layer | 105 | first magnetic layer |
| 106 | upper electrode layer | 107 | etching mask |
| 108 | insulation film | 110 | mounting table |
| 120A | first gas supply unit | 120B | second gas supply unit |
| 192 | processing chamber | S1 | plasma generation space |
| S2 | substrate processing space | W | target object |
| Z | residue | | |

What is claimed is:

1. A substrate processing method for removing reaction products generated in etching an etching target layer included in a target object by using a substrate processing apparatus including:
a processing chamber defining a space;
a partition unit which is disposed in the processing chamber and partitions the space into a plasma generating space and a substrate processing space, the partition unit being configured to suppress transmission of ions and vacuum ultraviolet rays;
a plasma source configured to generate a plasma in the plasma generating space;
a mounting table disposed in the substrate processing space for mounting the target object thereon;
a first processing gas supply unit configured to supply a first processing gas into the plasma generating space, the first processing gas to be dissociated by the plasma to generate radicals; and
a second processing gas supply unit configured to supply a second processing gas into the substrate processing space, the substrate processing method comprising:
generating the radicals by supplying the first processing gas from the first processing gas supply unit into the plasma generating space in which a plasma is generated;
moving the generated radicals into the substrate processing space; and
supplying the second processing gas from the second processing gas supply unit into the substrate processing space, thereby removing the reaction products by interaction between the radicals and the second gas without being exposed to the plasma.

2. The substrate processing method of claim 1, wherein the etching target layer includes a metal-containing layer.

3. The substrate processing method of claim 1, wherein the generating and the moving are performed before the supplying.

4. The substrate processing method of claim 1, wherein the generating and the moving are performed simultaneously with the supplying.

5. The substrate processing method of claim 1, wherein the generating, the moving and the supplying are performed in the same substrate processing apparatus.

6. The substrate processing method of claim 1, wherein the radicals cause a reduction reaction, an oxidation reaction, a chloride reaction or a fluoride reaction.

7. The substrate processing method of claim 1, wherein the first processing gas contains hydrogen atoms, oxygen atoms, chlorine atoms or fluorine atoms.

8. The substrate processing method of claim 1, wherein the second processing gas includes an electron-donating gas.

9. The substrate processing method of claim 1, wherein the supplying the second processing gas includes supplying at least one of HF, $Cl_2$, HCl, $H_2O$, $PF_3$, $F_2$, $ClF_3$, $COF_2$, cyclopentadiene, or amidinate.

10. The substrate processing method of claim 1, wherein the radicals include hydrogen radicals and the second processing gas includes $PF_3$, and
   wherein the reaction products are pre-treated by the hydrogen radicals.

11. The substrate processing method of claim 1, wherein the radicals include chloride radicals and the second processing gas includes cyclopentadiene, and
   wherein the reaction products are pre-treated by the chloride radicals.

12. The substrate processing method of claim 1, wherein the second processing gas supply unit includes a gas supply head disposed below the partition unit, and wherein the gas supply head includes gas holes that open toward the partition unit.

13. The substrate processing method of claim 1, wherein the reaction products are pre-treated with the radicals, and
   wherein the second gas reacts with the pre-treated reaction products to remove the pre-treated reaction products.

14. The substrate processing method of claim 13, wherein the second processing gas includes a gas whose reaction with the pre-treated reaction products is affected by a temperature of the mounting table.

* * * * *